United States Patent
Chang

(10) Patent No.: US 7,451,935 B2
(45) Date of Patent: Nov. 18, 2008

(54) PHOTORESIST MANAGEMENT SYSTEM

(75) Inventor: I-Hui Chang, Gangshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 401 days.

(21) Appl. No.: 11/179,313

(22) Filed: Jul. 12, 2005

(65) Prior Publication Data

US 2006/0255138 A1     Nov. 16, 2006

Related U.S. Application Data

(60) Provisional application No. 60/680,078, filed on May 12, 2005.

(51) Int. Cl.
*G06F 19/00* (2006.01)
(52) U.S. Cl. .................. 235/492; 700/231
(58) Field of Classification Search ............. 235/380, 235/492, 375; 700/231; 340/572.1
See application file for complete search history.

(56) References Cited

U.S. PATENT DOCUMENTS

| | | | | |
|---|---|---|---|---|
| 5,980,501 A * | 11/1999 | Gray | ............. | 604/408 |
| 7,256,888 B2 * | 8/2007 | Staehr et al. | ............. | 356/319 |
| 2002/0038392 A1 * | 3/2002 | De La Huerga | ............. | 710/8 |
| 2003/0011476 A1 * | 1/2003 | Godfrey | ............. | 340/572.8 |
| 2003/0183226 A1 * | 10/2003 | Brand et al. | ............. | 128/200.23 |
| 2004/0100415 A1 * | 5/2004 | Veitch et al. | ............. | 343/850 |
| 2005/0021165 A1 * | 1/2005 | Kuo | ............. | 700/115 |
| 2005/0177274 A1 * | 8/2005 | O'Dougherty et al. | ...... | 700/231 |

* cited by examiner

*Primary Examiner*—Daniel A Hess
(74) *Attorney, Agent, or Firm*—Haynes and Boone, LLP

(57) ABSTRACT

The present disclosure provides a system and method for managing photoresist fabrication. In one example, the system includes a holder that can removably receive a chemical container. The system includes chemical supply structure associated with the holder and adapted to be coupled to a processing module, wherein when a chemical container is removably disposed in the holder the chemical supply structure can carry a chemical away from the chemical container. The system includes an identification (ID) reader associated with the holder, wherein when a chemical container is removably disposed in the holder the ID reader automatically communicates with a container ID unit associated with the chemical container. The system includes a control module coupled to the ID reader and adapted to be coupled to a processing module.

18 Claims, 3 Drawing Sheets

PHOTORESIST MANAGEMENT SYSTEM

CROSS-REFERENCE

This application claims priority from U.S. Provisional Patent Application Ser. No. 60/680,078 filed on May 12, 2005, entitled, "Photoresist Management System."

BACKGROUND

Semiconductor integrated circuit (IC) fabrication involves a plurality of processes, including a photolithography process. A photolithography tool to implement the photolithography process includes a chemical supply arrangement to provide multiple chemicals from multiple chemical containers. When a chemical container is replaced with a new container, a barcode attached to the new chemical container may be scanned to identify chemical type. However, it is hard to prevent errors, for example where one chemical container is scanned but another one is used instead. Especially when two or more chemical containers are to be replaced at the same time, misplacement of chemicals can happen and cause processing failure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
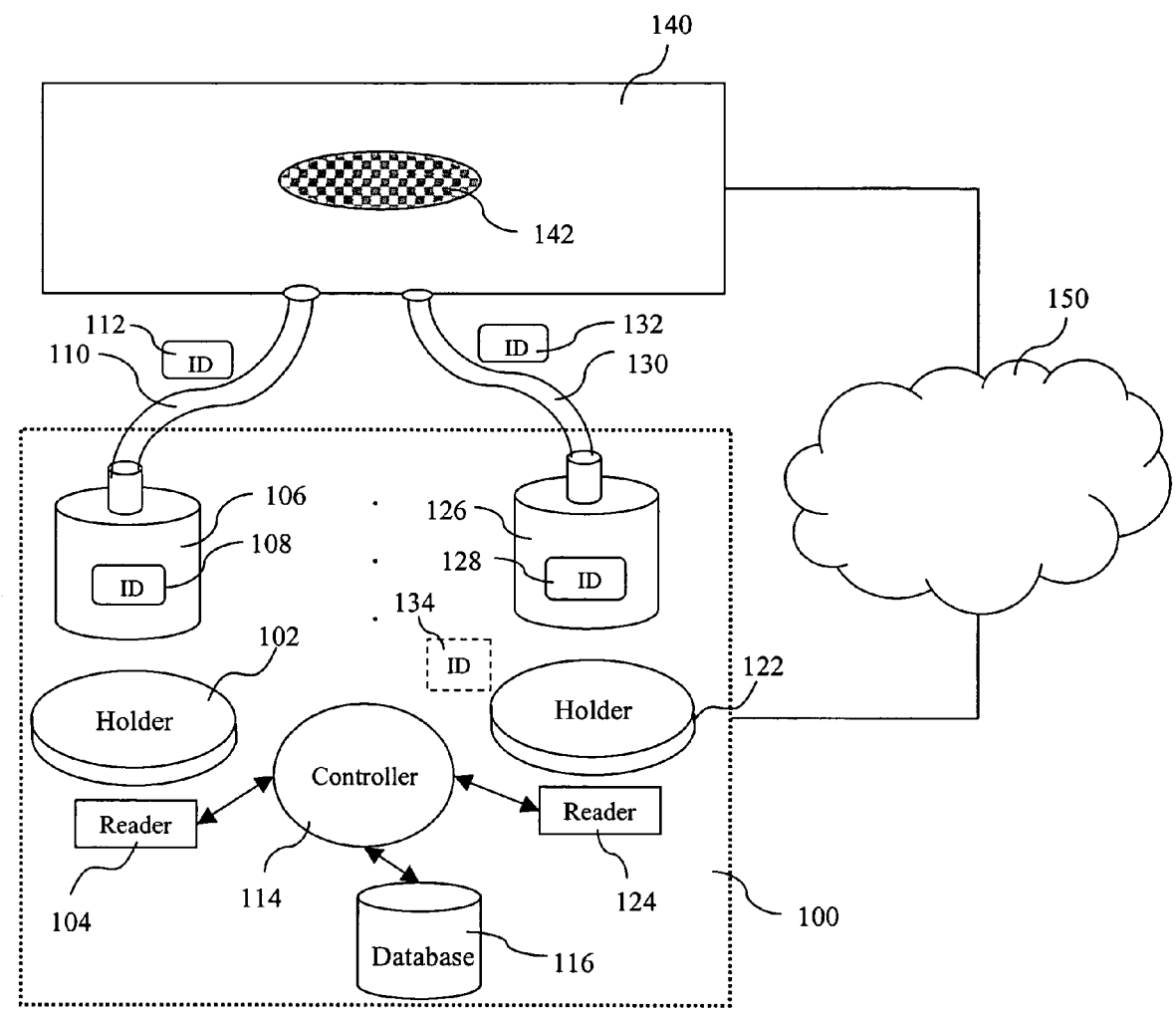
FIG. 1 is a block diagram of one embodiment of a photoresist management system (PRMS).

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1a is a simplified block diagram of one embodiment of a photoresist management system (PRMS) 100. The system 100 is configured and designed for identifying chemical material, verifying location, controlling, and checking the amount of chemical content. The system 100 may comprise a plurality of holders such as a holder 102 and a holder 122, as illustrated, each designed to hold a chemical container. Each holder may be pre-assigned to hold a certain type of chemical. Each holder is associated with an identification (ID) reader disposed adjacent thereto. For example, the holder 102 is associated with an ID reader 104 and the holder 122 is associated with an ID reader 124. An ID reader may be a radio-frequency identification (RFID) receiver. RFID technology allows an object to be identified at a distance, using radio waves to communicate with some form of tag or card. RFID technology has advantages such as the ability to hold more data, the ability to change the stored data as processing occurs, and the ability to be used in harsh environments. In another embodiment, an ID reader may be a smart card reader. A smart card contains an integrated circuit chip with memory and is used to hold identification information of personnel or material. The smart card reader can read from and write to the smart card for updating and maintaining chemical information appropriately. An ID reader may implement other suitable technologies. An ID reader may be positioned relative to its associated holder so that it functions properly according to ID reader technology. For example, a smart card may be properly disposed in different ways, depending on whether it is a contact or contactless card. An RFID tag may be positioned on the associated holder, under a chemical container to be held.

A chemical container may be placed onto a holder, and is then connected to a chemical tube that forms a path to transport a chemical from the chemical container to a photoresist coating chamber 140. The photoresist coating chamber 140 serves as a processing module, and is a component of a photoresist coating tool designed for coating a photoresist layer onto a substrate 142 such as a semiconductor wafer. In one example, the holder 102 holds a chemical container 106, and is connected to a chemical tube 110. The holder 122 holds a chemical container 126, and is connected to a chemical tube 130. More holders, associated chemical tubes, and chemical containers may be present in the system 100, as necessary according to photoresist processing requirements. Each chemical tube may have the chemical flow therethrough controlled by a flow controller. Each chemical container has a container ID unit attached thereto. For example, chemical containers 106 and 126 include container ID units 108 and 128, respectively. Each container ID unit or other ID unit can be a RFID tag, a smart card, or some other suitable ID component accessible by the associated ID reader.

The system 100 may include more ID units. For example, each chemical tube may have a tube ID unit attached thereto, for identifying the tube and providing tube information. In one example, the chemical tube 110 may have a tube ID unit 112 attached thereto. The chemical tube 130 may have a tube ID unit 132 attached thereto. Each chemical tube forms a path to transport a chemical from a corresponding chemical container to the photoresist coating chamber 140. A holder, an ID reader, a chemical tube, and/or a tube ID unit may form one path to provide one type of chemical to the photoresist coating chamber. Some chemical paths each may alternatively further include a bypass ID unit disposed within the effective communication distance of the associated ID reader, such that selected or all communication events related to the associated ID reader are bypassed in a situation such as the holder to the chemical path is set up to receive none chemical container. For example, a bypass ID unit 134 may be disposed to be associated with the holder 122. A bypass ID unit may be configured to have other functions alternatively or additionally. For example, when an event such as replacement of a chemical container to a holder is in progress, a communication between the associated ID reader and bypass ID unit may update the system 100 of the status, and may active the system to check back the holder and renew the database for new chemical container information after a certain period of time besides the predefined schedule. In another example, a bypass ID unit may be disposed and activated accordingly upon an event such as chemical container replacement, maintenance, and trouble shooting, and may be dismissed upon the completion of the event.

Each ID reader may be configured and set up such that it can properly read from and write to an associated ID unit (including a corresponding container ID unit, tube ID unit, and/or bypass ID unit). An RFID receiver may be set up to have an effective communication distance such that only the associated RFID tags that are properly positioned can communicate with the RFID reader. For instance, ID reader 104 may only communicate with container ID unit 108 and tube ID unit 112, while ID reader 124 may only communicate with container ID unit 128 and tube ID unit 132, without interference.

The system 100 further includes a chemical management controller 114 to communicate with ID readers and to control chemical supply to the photoresist coating chamber. The chemical management controller 114 comprises software to implement controlling, and has an ability to handle multiple ID readers simultaneously and dynamically. The chemical management controller 114 also comprises hardware, including a computer, a network, and/or an interface to bridge communication between the plurality of ID readers and the photoresist coating tool, a manufacturing execution system (MES), and/or a virtual fab that is described later. For example, the controller 114 may include an RS232 interface. The system 100 may further comprise a database 116 to support the chemical management controller 114, for example by maintaining chemical information such as a chemical versus holder table, an ID reading schedule, a current chemical content amount, a chemical expiration date, and other chemical information.

The photoresist management system 100 and/or photoresist coating chamber 140 may be coupled together and integrated into one photoresist processing tool, and/or may interact with other manufacturing entities through the chemical management controller 114 and/or a network 150. The network 150 may be a local network, part of an MES, or part of a virtual fab.

The system 100 may not be limited to management of photoresist chemical supply and control. For example, the system 100 can be extended to manage the supply of multiple chemical materials and the control associated with a process such as wet etching, chemical vapor deposition, or plating. The utilization of the system 100 can prevent errors relating to the supply of multiple chemicals and associated control, such as replacing a chemical container with a new container holding the wrong type of chemical. The system 100 avoids need to manually re-scan chemical information from barcode at power-up.

Figure 2:
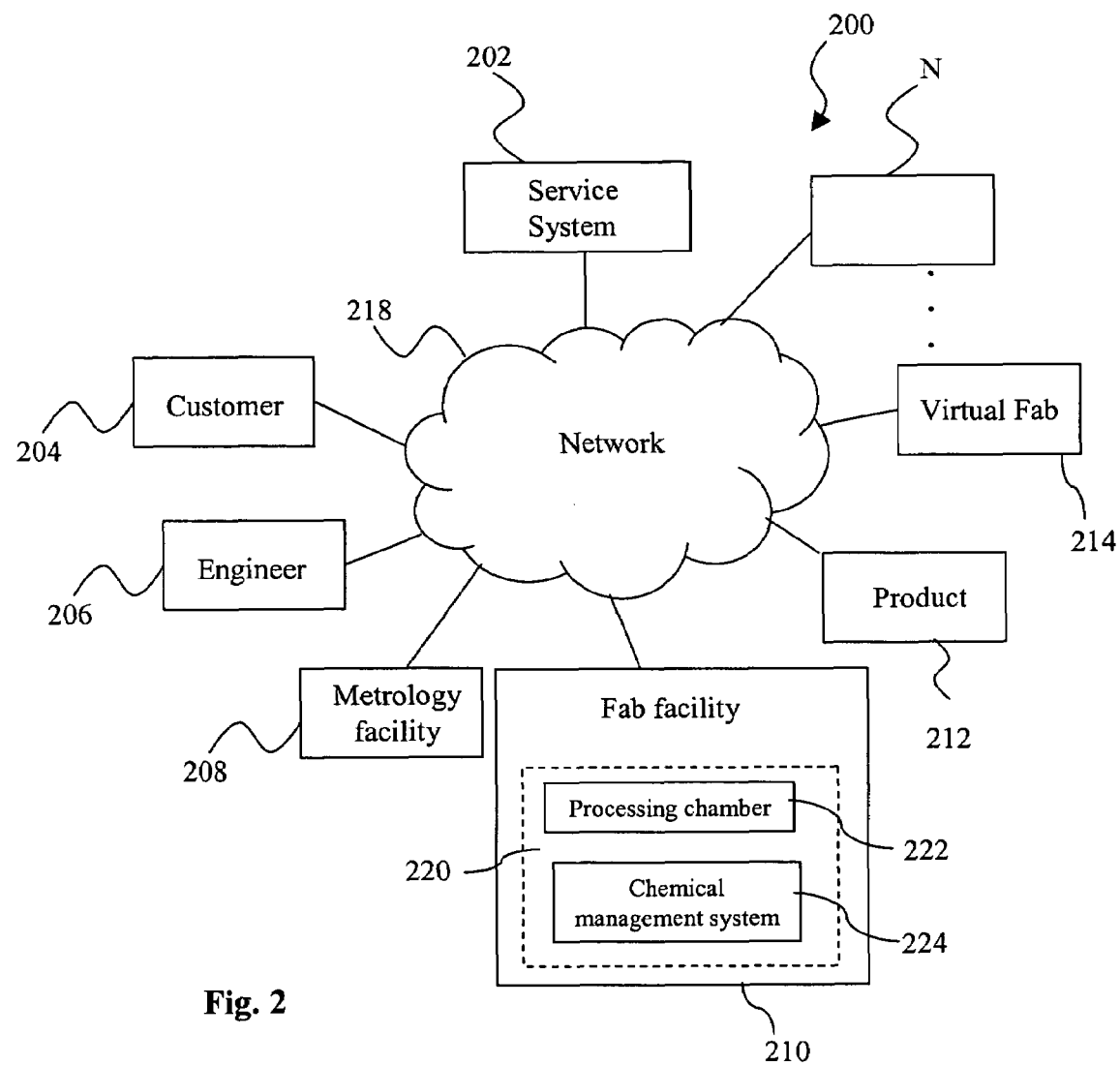
FIG. 2 is a block diagram of one embodiment of a virtual fabrication system within which the system of FIG. 1 may be utilized.

FIG. 2 illustrates a virtual IC fabrication system (a "virtual fab") 200, to which the photoresist management system 100 of FIG. 1 may be connected. The virtual fab 200 includes a plurality of entities 202, 204, 206, 208, 210, 212, 214, . . . , N that are connected by a communications network 218. The network 218 may be a single network, or may be a variety of different networks, such as an intranet and the Internet, and may include both wireline and wireless communication channels.

In the present example, the entity 202 represents a service system for service collaboration and provision, the entity 204 represents a customer, the entity 206 represents an engineer, the entity 208 represents a metrology facility for IC testing and measurement, the entity 210 represents a fabrication (fab) facility, the entity 212 represents a product, and the entity 214 represents another virtual fab (e.g., a virtual fab belonging to a subsidiary or a business partner). Each entity may interact with other entities, and may provide services to and/or receive services from the other entities.

For purposes of illustration, each entity 202-214 and 220-224 may be referred to as an internal entity (e.g., an engineer, customer service personnel, an automated system process, a design or fabrication facility, etc.) that forms a portion of the virtual fab 200, or may be referred to as an external entity (e.g., a customer) that interacts with the virtual fab 200. It is understood that the entities 202-214 and 220-224 may be concentrated at a single location, or may be distributed, and that some entities may be incorporated into other entities. In addition, each entity 202-216 and 220-224 may be associated with system identification information that allows control of access to information within the system, based upon authority levels associated with each entity identification information.

The virtual fab 200 enables interaction among the entities 202-216 and 220-224 for the purpose of IC manufacturing, as well as the provision of services. In the present example, IC manufacturing includes receiving a customer's IC order and the associated operations needed to produce the ordered ICs and send them to the customer, such as design, fabrication, testing, and shipping of the ICs.

Services provided by the virtual fab 200 may enable collaboration and information access in such areas as design, engineering, logistics, and material control. In the design area, the customer 204 may be given access to information and tools related to the design of their product, via the service system 202. The tools may enable the customer 204 to perform yield enhancement analyses, view layout information, and obtain similar information. In the engineering area, the engineer 206 may collaborate with other engineers using fabrication information regarding pilot yield runs, risk analysis, quality, reliability, and material control. The logistics area may provide the customer 204 with fabrication status, testing results, order handling, and shipping dates. It is understood that these areas are exemplary, and that more or less information may be made available via the virtual fab 200, as desired.

Another service provided by the virtual fab 200 may integrate systems between facilities, such as between the metrology facility 208 and the fab facility 210. Such integration enables facilities to coordinate their activities. For example, integrating the metrology facility 208 and the fab facility 210 may enable manufacturing information to be incorporated more efficiently into a fabrication process, and may enable wafer data from the metrology tools to be returned to the fab facility 210 for improvement and incorporation.

The fab facility 210 further comprises a manufacturing tool 220 having a processing chamber 222 and a chemical management system 224 such as the system 100 of FIG. 1. The manufacturing tool 220 may be a photoresist coating tool, a wet etching tool, a chemical vapor deposition tool, a plating tool, or another manufacturing tool having multiple chemical sources. The chemical management system 224 includes multiple holders that each have an ID reader. The chemical management system 224 is configured to hold a chemical container having a container ID unit attached thereto. Each chemical container is configured to provide a particular chemical to the processing chamber 222. The chemical management system 224 further comprises a chemical management controller to monitor, coordinate, and verify each chemical container, including chemical type, holder location, connected tube, chemical content volume, chemical expiration date, and other information. The chemical management system 224 may provide chemical related information to other entities, such as an engineer 206, other manufacturing tools of the fab facility 210, and/or a product 212, through the network 218. The chemical management system 224 may extract related information from the processing chambers 222 and other entities, to write back to the ID units that are each attached to a chemical container or a chemical tube. For example, a chemical flow rate from each chemical path may be collected to find out a chemical consumption and current chemical content volume. In another embodiment, sensors may be used to obtain information about chemical content volume. Reading and writing ID units in the chemical management system 224 may be triggered by a predefined updating schedule, or by an event such as chemical content volume being below a certain minimum limit. The chemical management system 224 can dynamically maintain and ensure the supply of multiple chemicals to the processing chamber 222 and prevent errors such as placing the wrong type of chemical in a given position, and/or placing a chemical in the wrong position. The chemical management system 224 can ensure that each chemical container is properly positioned, changed, and used during its lifetime. Furthermore, chemical related information from the ID units, chemical tubes, and the processing chamber may be further collected and saved for future use, including quality control, reliability testing, and failure mode analysis.

Figure 3:
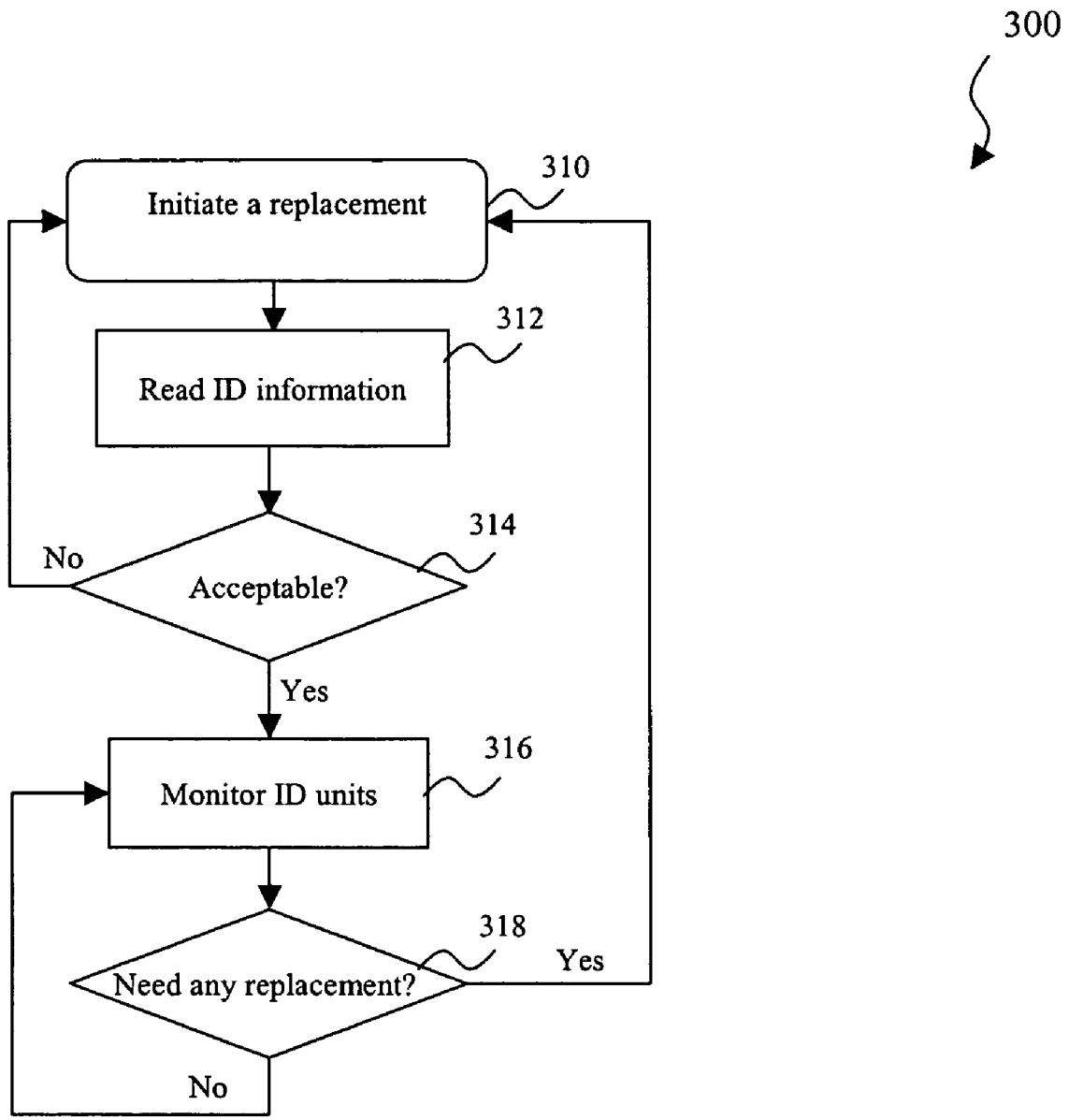
FIG. 3 is a flow chart of an embodiment of a method to implement the PRMS of FIG. 1 or the system of FIG. 2.

FIG. 3 illustrates a flow chart of an exemplary method 300 to implement the system 100 of FIG. 1 and/or the system 200 of FIG. 2, according to the present disclosure. Referring to FIG. 3 and with additional reference to FIG. 1, the method 300 begins at step 310 by initiating a chemical container replacement. Each of the multiple holders in the chemical management system may be set to hold a chemical container having a particular type of chemical, according to a processing recipe and/or specification. Each chemical flows through a chemical tube to the photoresist coating chamber 140, where they are combined to form a photoresist on a substrate. The chemical flow in each chemical path is controlled by a flow controller, such as a master flow controller for turning flow on and off, and ensuring a proper flow rate. The chemical management controller 114 may monitor the plurality of chemical containers, and update the system 100 and/or the ID units. A replacement may be triggered by various events. For example, the chemical management controller 114 may signal an engineer when a chemical container needs to be replaced because the chemical is going to expire within a predefined period of time, or because the chemical content is below a predefined level. A replacement may be triggered by other events. For example, a manufacturing personnel such as an operator may take away one chemical container from the system 100 for other temporary use; an engineer may request a replacement through the MES; or the photoresist coating chamber may request a replacement according to other manufacturing data, such as processing chamber contamination detected by a residual gases analysis (RGA).

At step 310, when the replacement is initiated, other protective and notice actions may be automatically generated and applied by the chemical management controller 114. For example, the chemical management controller 114 may generate a notice or alarm to inform the manufacturing personnel to carry out the chemical replacement. Furthermore, the chemical management controller 114 may put the photoresist coating chamber and/or related processing components on hold or into a protective state.

At step 310, when a replacement is triggered either by taking away a current chemical container or by other events as described above, a manufacturing personnel may bring a new chemical container for placement and place it properly onto an associated holder, and may further connect it to a chemical tube. The new chemical container includes an attached container ID unit having relevant information stored therein, including chemical type, chemical content volume, expiration date, and other relevant information.

The method 300 proceeds to step 312 to read ID information. When the new chemical container is placed onto the corresponding holder, the associated ID reader may be automatically activated to read from the attached container ID unit the relevant information, such as chemical type and chemical expiration date. The associated ID reader may also read the corresponding tube ID unit for relevant tube information.

The method 300 proceeds to step 314 to verify the relevant information from the attached container ID unit or additional information from the corresponding tube ID unit. At step 314, the relevant information from the attached container ID unit is verified if the chemical container is in agreement with the holder. Alternatively, the relevant information from the connected tube ID unit may be further verified if the chemical tube is paired with the chemical container and the holder. Further, the chemical expiration date and/or chemical content volume may be checked. If all of the verification is approved, then the replacement is acceptable. Otherwise, the replacement is not acceptable.

If the replacement is not acceptable after the above verification, the method 300 will return to step 310 to initiate another replacement. For example, if the chemical expiration date is within a predefined time gap, the chemical content volume is below a predefined level, or the chemical type does not match a predefined chemical type for the associated holder, the replacement is not acceptable. In one example, a signal light may be used to inform the manufacturing personnel whether the chemical is approved, by using a green light if the chemical container is acceptable, or a red light if the chemical container is not acceptable.

If the replacement is acceptable at step 314, the method 300 proceeds to step 316. At step 316, any prohibition and hold caused by the replacement may be released so normal processing can resume. The ID units are monitored according to a predefined checking schedule for chemical content volume, expiration date, and other information. For example, each chemical container may be checked about every 5 seconds. During step 316, the container ID units may be updated for chemical content volume. For example, the chemical content volume of each chemical container may be obtained from a previous chemical content volume and an accumulated chemical flow from the associated chemical tube rate, and is written back to the container ID unit. The updated chemical information may be provided through the chemical management controller 114 and/or the network to other entities, such as other processing tools, engineers, and/or the MES.

The method 300 may proceed to step 318 to timely check whether a replacement is needed. A replacement may be needed when a chemical container has a content volume below a predefined limit, the chemical is within a predefined time window of expiration, or a chemical is contaminated. If a replacement is needed, the method 300 then returns to step 310 for a replacement as previously described. Otherwise, the method 300 may resume continuous monitoring of all ID units.

The exemplary method 300 may be applied to a process having multiple chemical resources, including photoresist coating, chemical vapor deposition, plating, and wet etching. Other processes may also implement the method 300 without departing from of the spirit of the present disclosure. The method 300 utilizes system 100 and/or system 200 to manage multiple chemicals using multiple ID readers, to identify chemical content, to verify location of each chemical container, to read from and write back to ID units, and to dynamically maintain and monitor each chemical for its content volume, expiration, and other information.

Thus The present disclosure provides a system and method for managing photoresist fabrication. In one example, the system includes a holder that can removably receive a chemical container. The system includes chemical supply structure associated with the holder and adapted to be coupled to a processing module, wherein when a chemical container is removably disposed in the holder the chemical supply structure can carry a chemical away from the chemical container. The system includes an identification (ID) reader associated with the holder, wherein when a chemical container is removably disposed in the holder the ID reader automatically communicates with a container ID unit associated with the chemical container. The system includes a control module coupled to the ID reader and adapted to be coupled to a processing module.

In the system, the ID reader may comprise a smart card reader. The ID reader may comprise a radio-frequency ID (RFID) receiver. The system may further comprise a bypass ID unit associated with the holder, wherein the bypass ID unit is configured to communicate with the ID reader. The ID reader may be set up to read chemical information from the container ID unit according to a predefined schedule. The ID reader is set up to read chemical type information from the container ID unit. The ID reader may be set up to write chemical information to the container ID unit according to a predefined schedule. The ID reader may be set up to write current chemical content volume of the chemical container to the container ID unit. The container ID unit may store chemical information selected from the group consisting of chemical type, chemical content volume, chemical expiration date, and combinations thereof. The system may further comprise a network that communicates with the control module and other processing tools. The control module may be set up to generate an alarm if the container ID unit has a parameter out of range. The controller module may be set up to generate an alarm if the chemical container has a chemical expiration date within a predefined time gap.

In another embodiment, the present disclosure provides A system comprising, a photoresist coating module, a plurality of holders each designed to hold a chemical container, wherein the chemical container is configured to be coupled to the photoresist coating module and includes an identification (ID) unit, a plurality of ID readers, wherein each ID reader is associated with one of the plurality of holders and is configured to communicate with the ID unit corresponding to the chemical container, and a control module that communicates with the plurality of ID readers and the photoresist coating chamber. The system may further comprise a virtual fab that communicates with the control module.

In another embodiment, the present disclosure provides a method for managing chemical sources. The method includes replacing a chemical container having a container identification (ID) unit associated therewith to a holder, automatically reading chemical information from the container ID unit, matching the chemical information to the holder, and repeating the replacing and reading if the matching is not acceptable.

In the above method, the automatically reading a container ID unit may comprise reading chemical data selected from the group consisting of chemical type, chemical content volume, chemical expiration date, and combinations thereof. The matching the chemical information may comprise identifying chemical type in the chemical container. The method may further comprise monitoring the container ID unit to generate an alarm for a chemical replacement, updating the container ID unit by writing back chemical content volume thereto, and sharing the chemical information from the container ID unit with other manufacturing tools. The method may further comprise reading tube information from a tube ID unit with an ID reader, wherein the tube ID unit is associated with a chemical tube to carry a chemical away from the chemical container. The replacing a chemical container may be initiated by an event selected from the group consisting of low chemical content volume, chemical expiration, an engineer request from an manufacturing execution system, and removal of the chemical container by a manufacturing personnel.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A system comprising:
   a holder that can removably receive a chemical container;
   a chemical supply structure associated with the holder and adapted to be coupled to a semiconductor processing module, wherein when the chemical container is removably disposed in the holder, the chemical supply structure can carry a chemical away from the chemical container;
   an identification (ID) reader associated with the holder, wherein when the chemical container is removably disposed in the holder the ID reader automatically communicates with a container ID unit associated with the chemical container; and
   a control module coupled to the ID reader and adapted to be coupled to the semiconductor processing module; and
   a network and database that communicates with the control module, wherein the database maintains chemical information including chemical versus holder table information, an ID reading schedule, current chemical content amount, chemical expiration date, and other chemical information.

2. The system of claim 1, wherein the ID reader comprises a smart card reader.

3. The system of claim 1, wherein the ID reader comprises a radio-frequency ID (RFID) receiver.

4. The system of claim 1 further comprising a bypass ID unit associated with the holder, wherein the bypass ID unit is configured to communicate with the ID reader in lieu of the container ID unit associated with the chemical container.

5. The system of claim 1, wherein the ID reader is set up to read chemical information from the container ID unit according to a predefined schedule.

6. The system of claim 1, wherein the ID reader is set up to read chemical type information from the container ID unit.

7. The system of claim 1, wherein the ID reader is set up to write chemical information to the container ID unit according to a predefined schedule.

8. The system of claim 1, wherein the ID reader is set up to write current chemical content volume of the chemical container to the container ID unit.

9. The system of claim 1, wherein the container ID unit stores chemical information selected from the group consisting of chemical type, chemical content volume, chemical expiration date, and combinations thereof.

10. The system of claim 1, wherein the network connection is used to communicate with other processing tools and other entities through a network.

11. The system of claim 1, wherein the control module is set up to generate an alarm if the container ID unit has a parameter out of range.

12. The system of claim 1, wherein the control module is set up to generate an alarm if the chemical container has a chemical expiration date within a predefined time gap.

13. The system of claim 1 wherein the network connection that communicates with the control module comprises a virtual fab.

14. A method for managing chemical sources, comprising:
replacing a chemical container having a container identification (ID) unit associated therewith to a holder;
automatically reading chemical information from the container ID unit;
matching the chemical information to the holder;
repeating the replacing and reading if the matching is not acceptable;
monitoring the container ID unit to generate an alarm for a chemical replacement;
updating the container ID unit by writing back chemical content volume thereto; and
sharing the chemical information from the container ID unit with other manufacturing tools.

15. The method of claim 14, wherein the automatically reading a container ID unit comprises reading chemical data selected from the group consisting of chemical type, chemical content volume, chemical expiration date, and combinations thereof.

16. The method of claim 14, wherein the matching the chemical information comprises identifying chemical type in the chemical container.

17. The method of claim 14 further comprising reading tube information from a tube ID unit with an ID reader, wherein the tube ID unit is associated with a chemical tube to carry a chemical away from the chemical container.

18. The method of claim 14, wherein the replacing a chemical container is initiated by an event selected from the group consisting of low chemical content volume, chemical expiration, an engineer request from a manufacturing execution system, and removal of the chemical container by a manufacturing personnel.

* * * * *